United States Patent
Kar Roy et al.

(10) Patent No.: US 6,943,414 B2
(45) Date of Patent: Sep. 13, 2005

(54) METHOD FOR FABRICATING A METAL RESISTOR IN AN IC CHIP AND RELATED STRUCTURE

(75) Inventors: Arjun Kar Roy, Irvine, CA (US); David Howard, Irvine, CA (US); Q.Z. Liu, Essex Junction, VT (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/073,751

(22) Filed: Feb. 9, 2002

(65) Prior Publication Data

US 2002/0132442 A1 Sep. 19, 2002

Related U.S. Application Data

(60) Provisional application No. 60/276,277, filed on Mar. 15, 2001.

(51) Int. Cl.$^7$ .......................... H01L 29/76; H01L 29/94; H01L 31/062; H01L 31/113; H01L 31/119
(52) U.S. Cl. ...................... 257/379; 257/380; 257/533; 257/758; 257/759; 257/760; 438/171; 438/190; 438/210; 437/918
(58) Field of Search .................................. 257/379, 380, 257/533, 350, 351, 358, 536–538, 758–760, 359, 577, E51.003; 438/171, 190, 210, 238, 239, 330, 381, 382, 384, FOR 427, FOR 429; 437/918

(56) References Cited

U.S. PATENT DOCUMENTS

| | | | | |
|---|---|---|---|---|
| 3,862,017 A | * | 1/1975 | Tsunemitsu et al. | 205/124 |
| 3,868,720 A | * | 2/1975 | New et al. | 257/582 |
| 4,795,921 A | * | 1/1989 | Kato et al. | 326/94 |
| 5,120,572 A | * | 6/1992 | Kumar | 216/16 |
| 5,270,493 A | * | 12/1993 | Inoue et al. | 174/253 |
| 5,422,307 A | * | 6/1995 | Ishii | 438/384 |
| 5,525,831 A | * | 6/1996 | Ohkawa et al. | 257/543 |
| 5,929,510 A | * | 7/1999 | Geller et al. | 257/635 |
| 6,117,789 A | * | 9/2000 | Lee | 438/706 |
| 6,232,194 B1 | * | 5/2001 | Yaung et al. | 438/382 |
| 6,627,539 B1 | * | 9/2003 | Zhao et al. | 438/638 |

FOREIGN PATENT DOCUMENTS

JP        06334137 A   * 12/1994

* cited by examiner

*Primary Examiner*—George Eckert
*Assistant Examiner*—Chris C. Chu
(74) *Attorney, Agent, or Firm*—Farjami & Farjami LLP

(57) ABSTRACT

According to one exemplary embodiment, an integrated circuit chip comprises a first interconnect metal layer. The integrated circuit chip further comprises a first intermediate dielectric layer situated over the first interconnect metal layer. The integrated circuit chip further comprises a metal resistor situated over the first intermetallic dielectric layer and below a second intermetallic dielectric layer. The integrated circuit chip further comprises a second interconnect metal layer over the second intermetallic dielectric layer. The integrated circuit chip further comprises a first intermediate via connected to first terminal of the metal resistor, where the first intermediate via is further connected to a first metal segment patterned in the second interconnect metal layer. The integrated circuit chip further comprises a second intermediate via connected to a second terminal of the metal resistor, where the second intermediate via is further connected to a second metal segment patterned in the second interconnect metal layer.

20 Claims, 4 Drawing Sheets

US 6,943,414 B2

METHOD FOR FABRICATING A METAL RESISTOR IN AN IC CHIP AND RELATED STRUCTURE

The present application claims the benefit of a pending provisional patent application entitled "Metal Resistor" invented by Arjun Kar Roy, David Howard, and Q. Z. Liu, Ser. No. 60/276,277 filed on Mar. 15, 2001. The disclosure in that pending provisional application is hereby incorporated fully by reference into the present application.

BACKGROUND OF THE INVENTION

1. Field of the Invention

The present invention relates to the field of fabrication of semiconductor devices. More specifically, the invention relates to the fabrication of resistors for integrated circuits.

2. Related Art

Consumer demand for smaller, more complex, and faster devices operating at high frequencies, such as wireless communications devices and Bluetooth RF transceivers, has in turn resulted in an increased demand for integrated circuit ("IC") chips that can operate at higher frequencies. For IC chips to be able to operate at higher frequencies, such as frequencies above 10.0 GHz, the electronic circuits in the IC chips, and the electronic components that form the electronic circuits, must also be able to operate at higher frequencies. However, as the frequency of operation increases, unwanted capacitance, i.e. parasitic capacitance, in IC chip components, such as resistors, can also undesirably increase. Thus, for example, IC chip manufacturers are challenged to fabricated IC chips having resistors with reduced parasitic capacitance.

In a conventional IC chip, polysilicon resistors are commonly used, and may be fabricated using metal oxide semiconductor ("MOS") technology. For example, a polysilicon resistor may be fabricated by depositing a polysilicon film on a field oxide region in the IC chip. The polysilicon film may be deposited, for example, using a low-pressure chemical vapor deposition ("LPCVD") process. The deposited polysilicon film may then be patterned and etched to form a resistor.

By way of background, capacitance develops, for example, when two plates made of an electrically conducting material are separated by a dielectric. The resulting capacitance is inversely proportional to the distance, or thickness, separating the two plates. In the polysilicon resistor, the polysilicon in the body of the resistor forms one plate of a capacitor. The silicon substrate, which is situated below the field oxide region, typically forms the second plate of the capacitor. The field oxide, which typically comprises a dielectric such as silicon dioxide, forms the dielectric for the above capacitor. Thus, a capacitance is developed between the polysilicon in the resistor and the silicon substrate of the IC chip. The value of the capacitance between the polysilicon resistor and the silicon substrate is inversely proportional to the distance between the polysilicon resistor and the silicon substrate. This capacitance is undesirable, i.e. parasitic, since a resistor should ideally have no capacitance. Since the polysilicon resistor is situated relatively close to the silicon substrate of the IC chip, the parasitic capacitance developed between the polysilicon resistor and the silicon substrate can be undesirably large, especially at frequencies above 10.0 GHz.

Other types of resistors used in a conventional IC chip include, for example, diffused, n-well, and p-well resistors. However, similar to polysilicon resistors discussed above, diffused, n-well, and p-well resistors suffer from a large parasitic capacitance due to the junctions that these resistors form with the silicon substrate.

Thus, there is a need in the art for a resistor having a reduced parasitic capacitance that can be fabricated in an IC chip.

SUMMARY OF THE INVENTION

The present invention is directed to a method for fabricating a metal resistor in an IC chip and related structure. The present invention addresses and resolves the need in the art for a metal resistor in an IC chip that achieves reduced parasitic capacitance.

According to one exemplary embodiment, an integrated circuit chip comprises a first interconnect metal layer. For example, the first interconnect metal layer may be aluminum. The integrated circuit chip further comprises a first intermediate dielectric layer situated over the first interconnect metal layer. The first intermediate dielectric layer, for example, may be HDPCVD silicon dioxide. The integrated circuit chip further comprises a metal resistor situated over the first intermetallic dielectric layer and below a second intermetallic dielectric layer. The metal resistor, for example, may be titanium nitride or tantalum nitride.

According to this exemplary embodiment, the integrated circuit chip further comprises a second interconnect metal layer over the second intermetallic dielectric layer. The integrated circuit chip further comprises a first intermediate via connected to a first terminal of the metal resistor, where the first intermediate via is further connected to a first metal segment patterned in the second interconnect metal layer. The integrated circuit chip further comprises a second intermediate via connected to a second terminal of the metal resistor, where the second intermediate via is further connected to a second metal segment patterned in the second interconnect metal layer.

According to this exemplary embodiment, the integrated chip may further comprise a dielectric cap layer situated between the metal resistor and the second intermetallic dielectric layer. The dielectric cap layer, for example, may be silicon nitride. The integrated chip may further comprise an oxide cap layer situated between the metal resistor and the first intermetallic dielectric layer. The oxide cap layer, for example, may be PECVD silicon dioxide. In another embodiment, the present invention is a method that achieves the above-described integrated circuit chip. Other features and advantages of the present invention will become more readily apparent to those of ordinary skill in the art after reviewing the following detailed description and accompanying drawings.

DETAILED DESCRIPTION OF THE INVENTION

The present invention is directed to method for fabricating a metal resistor in an IC chip and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

FIGS. 1 through 11 show cross sectional views of various features and components of a structure which includes various features and components of an embodiment of the invention as described below. Certain details and features have been left out which are apparent to a person of ordinary skill in the art. The structure includes an exemplary metal resistor, which can be included in an integrated circuit ("IC") chip manufactured using various process flows. For example, the IC chip including the exemplary metal resistor may be manufactured using a silicon-germanium bipolar and complementary metal oxide semiconductor ("BiCMOS") process.

The invention's metal resistor can be formed during the process steps involving formation of interconnect metal layers of an IC chip, also referred to as the "backend process" in the present application. The invention's metal resistor confers advantages such as reduced parasitic capacitance by providing increased distance between the metal resistor and the IC chip substrate.

In one embodiment, present invention provides a process for fabricating a metal resistor in an aluminum "backend process" without disturbing the standard backend process flow. In other words, the invention's process for fabricating a metal resistor can be performed in a manner which can be either included or excluded from the aluminum backend process without impacting the aluminum backend process. The placement of the invention's process steps in the standard metal backend processing is a novel approach that provides several advantages in resistor fabrication, such as facilitating the fabrication of resistors with low parasitic capacitance.

Figure 1:
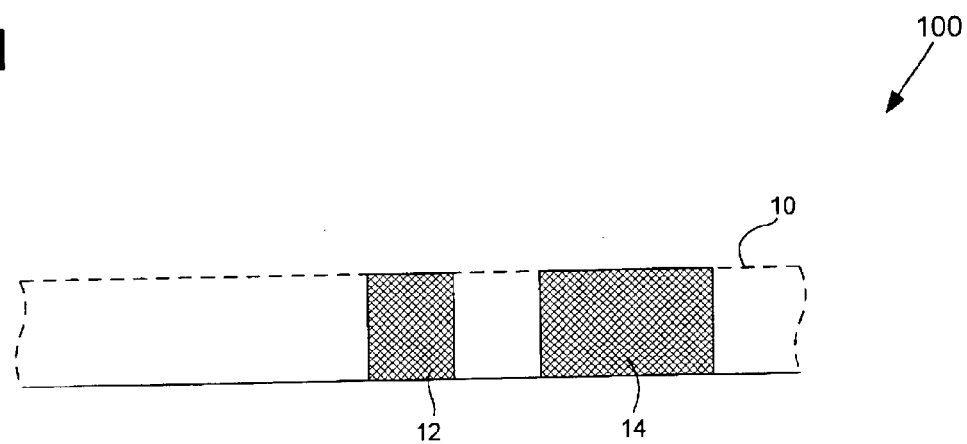
FIG. 1 illustrates a cross sectional view of an exemplary portion of a chip utilized in the fabrication of a metal resistor in accordance with one embodiment of the present invention.

FIG. 1 shows a cross sectional view of a portion of an IC chip utilized in the fabrication of a metal resistor in accordance with one embodiment of the present invention. Structure 100 includes metal segments 12 and 14, which are fabricated in interconnect metal layer 10. For example, in an aluminum backend process, interconnect metal layer 10 can be patterned and etched using a subtractive etch process to fabricate metal segments 12 and 14. Interconnect metal layer 10 can comprise a single metal such as aluminum. In one embodiment, interconnect metal layer 10 may comprise a "metal stack" which uses aluminum as the primary metal in the stack. It is noted that interconnect metal layer 10 can be any interconnect metal layer other than the top interconnect metal layer in the IC chip.

Figure 2:
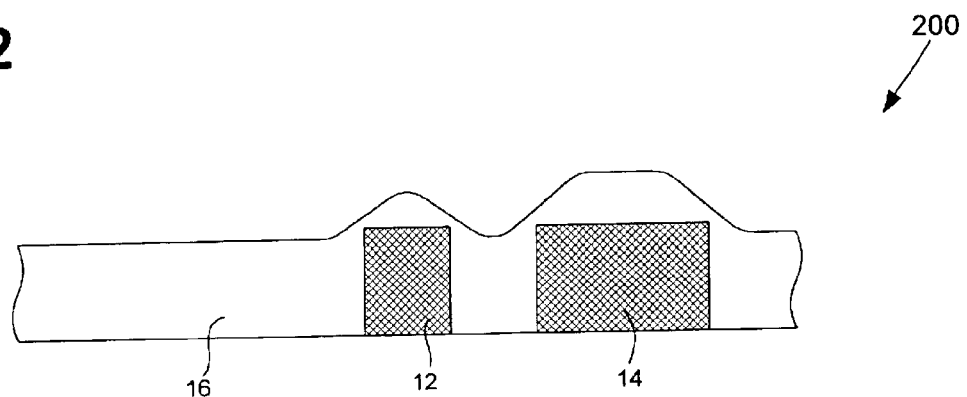
FIG. 2 illustrates a cross sectional view of the exemplary structure of FIG. 1 after deposition of an intermetallic dielectric layer, in accordance with one embodiment of the present invention.

FIG. 2 shows structure 100 in FIG. 1 after deposition of intermetallic dielectric ("IMD") layer 16. In structure 200, IMD layer 16 is used as a dielectric deposition step in the present exemplary aluminum backend process to "fill gaps" between patterned metal segments, such as metal segments 12 and 14, in interconnect metal layer 10. The thickness of IMD layer 16, for example, can be approximately 5,000.0 Angstroms to 9,000.0 Angstroms for a CMOS process with a 0.18 micron feature size. IMD layer 16 can be formed by high-density plasma chemical vapor deposition ("HDPCVD") of silicon dioxide. In one embodiment, IMD layer 16 can be formed by spin-on dielectric deposition. In another embodiment, IMD layer 16 may be formed by a chemical vapor deposition ("CVD") process other than an HDPCVD process.

Figure 3:
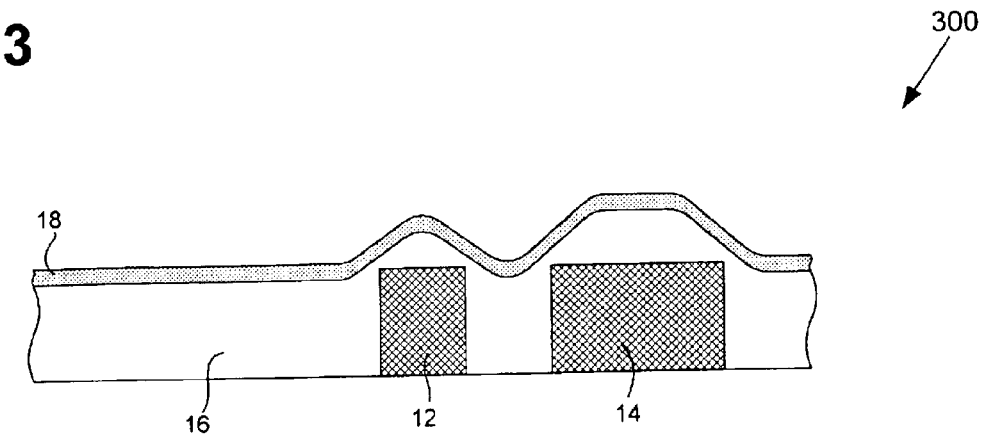
FIG. 3 illustrates a cross sectional view of the exemplary structure of FIG. 2 after deposition of a dielectric cap layer, in accordance with one embodiment of the present invention.

FIG. 3 shows structure 200 in FIG. 2 after deposition of dielectric "cap" layer 18. In structure 300, oxide cap layer 18 is utilized to fill any remaining gaps or weak seams in IMD layer 16. Oxide cap layer 18 also provides an overetch margin for subsequent steps of metal resistor formation and etching. In other words, oxide cap layer 18 allows a margin of error for the subsequent steps by providing extra material which must be etched away before underlying layers can be damaged by, for example, over etching. Oxide cap layer 18 may comprise silicon dioxide, and may be formed by plasma enhanced chemical vapor deposition ("PECVD"). In one embodiment, oxide cap layer 18 can be omitted. In other words, oxide cap layer 18 is optional.

Figure 4:
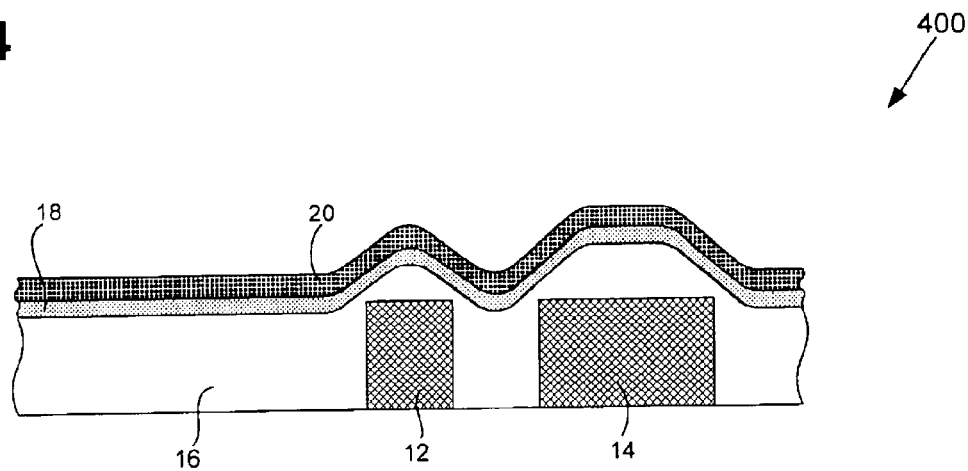
FIG. 4 illustrates a cross sectional view of the exemplary structure of FIG. 3 after deposition of a resistor metal layer, in accordance with one embodiment of the present invention.

FIG. 4 shows structure 300 in FIG. 3 after deposition of resistor metal layer 20. A portion of resistor metal layer 20 in structure 400 will be utilized to form the invention's metal resistor in subsequent processing steps. Resistor metal layer 20 may comprise a "refractory semi-metal," such as titanium nitride ("TiN") or tantalum nitride ("TaN"). However, resistor metal layer 20 may comprise other metal-based materials having a high resistivity. The thickness of resistor metal layer 20 can be, for example, approximately 100.0 Angstroms to 1500.0 Angstroms, which results in a resistivity of approximately 10.0 to 500.0 ohms per square. The stoichiometry of TiN and TaN films can be adjusted to manipulate the deposition rate and control the uniformity of deposition as well as to control various electrical properties of the resulting deposited resistor metal layer 20, such as resistivity. Resistor metal layer 20 may be deposited, for example, using physical vapor deposition ("PVD"), sputtering, evaporation, or CVD.

Figure 5:
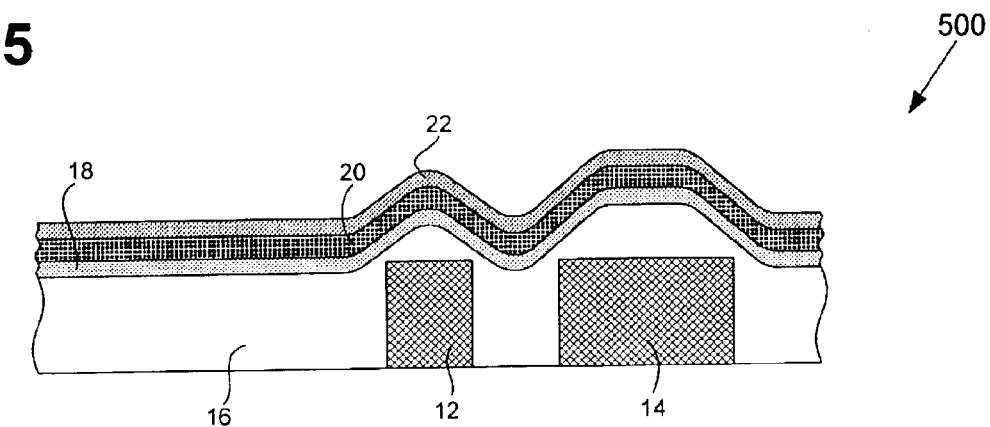
FIG. 5 illustrates a cross sectional view of the exemplary structure of FIG. 4 after deposition of a dielectric cap layer, in accordance with one embodiment of the present invention.

FIG. 5 shows structure 400 in FIG. 4 after deposition of dielectric cap layer 22. In structure 500, dielectric cap layer 22 can comprise silicon nitride or other suitable nitrogen-based dielectric. In one embodiment, another type of dielectric other than a nitrogen-based dielectric may be used. In the present embodiment, dielectric cap layer 22 can be used to protect the top surface of a metal resistor that will be formed in resistor metal layer 20, to provide a selective etch stop for subsequent via etch, and to provide an antireflective coating ("ARC") for more exact patterning of resistor metal layer 20. For example, a provision for a selective etch stop for subsequent via etch can prevent etching through a metal resistor formed in resistor metal layer 20 if the subsequent via etch encounters different dielectric etch depths on top of the standard aluminum interconnect metal layer and on top of the metal resistor. In one embodiment, dielectric cap layer 22 may not be used.

Figure 6:
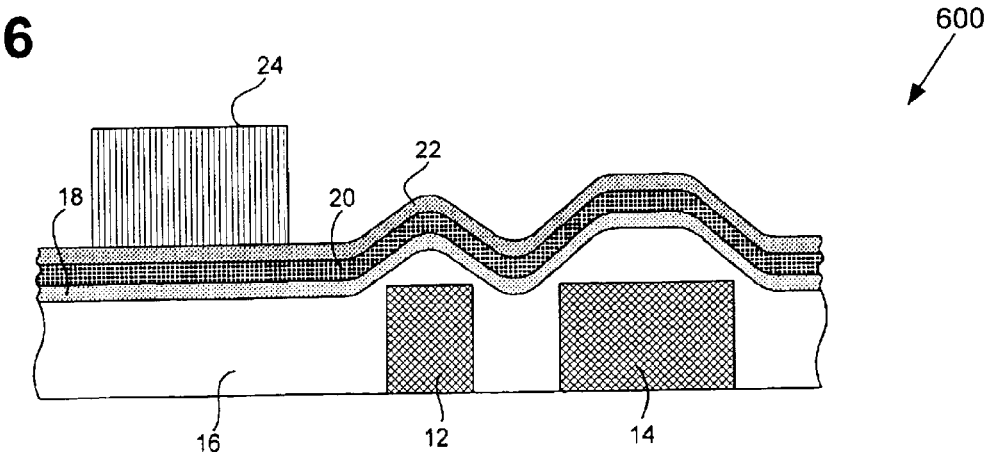
FIG. 6 illustrates a cross sectional view of the exemplary structure of FIG. 5 after formation of a mask, in accordance with one embodiment of the present invention.

FIG. 6 shows structure 500 in FIG. 5 after formation of mask 24 on dielectric cap layer 22. Mask 24 is used to pattern a metal resistor, which will be formed in resistor metal layer 20. Mask 24 defines the width of the metal resistor that will be formed in resistor metal layer 20, and may comprise, for example, photoresist. The length of the metal resistor to be formed in resistor metal layer 20 is defined by the location of vias used to connect the two terminals of the metal resistor to a interconnect metal layer subsequently formed above the metal resistor.

Figure 7:
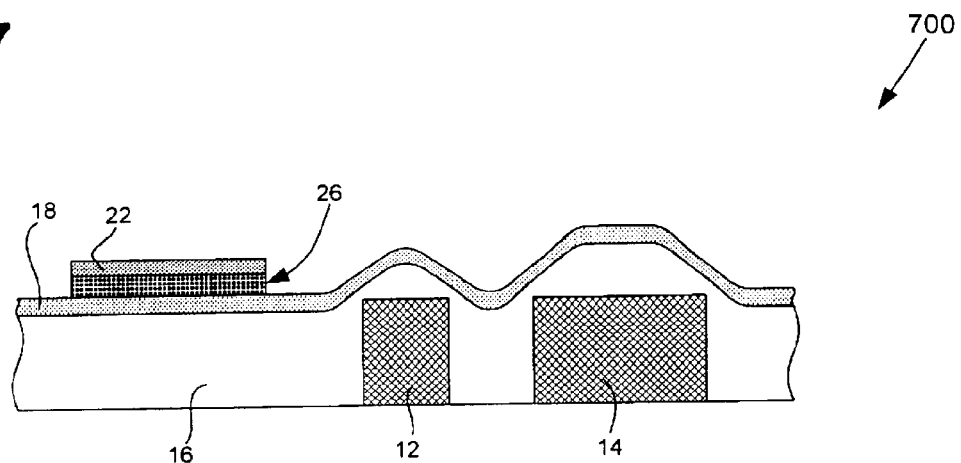
FIG. 7 illustrates a cross sectional view of the exemplary structure of FIG. 6 after selective etching of the dielectric cap layer and the resistor metal layer, and removal of the mask, in accordance with one embodiment of the present invention.

FIG. 7 shows structure 600 in FIG. 6 after selective etching of dielectric cap layer 20 and resistor metal layer 20, and removal of mask 24. The etching is done selectively, i.e. etchants are used which etch dielectric cap layer 20 and resistor metal layer 20 but do not substantially etch oxide cap layer 18. Metal resistor 26 is thus formed by the above etch, and the boundaries of metal resistor 26 are determined by mask 24 in FIG. 6. Metal resistor 26, for example, can be approximately 1.0 micron to 1,000.0 microns in length and can range in resistance from approximately 1.0 ohm to 500.0 thousand ohms. As shown in FIG. 7, dielectric cap layer 22 protects the top surface of metal resistor 26. Dry etch chemistry including, for example, chlorine (C12), and Argon (Ar), can be used to etch dielectric cap layer 22 and resistor metal layer 20. However, fluorine based etch chemistries such as CF4 and CHF3 may also be used as well as wet etch chemistries that can etch resistor metal layer 20 and are selective to oxide cap layer 18.

Figure 8:
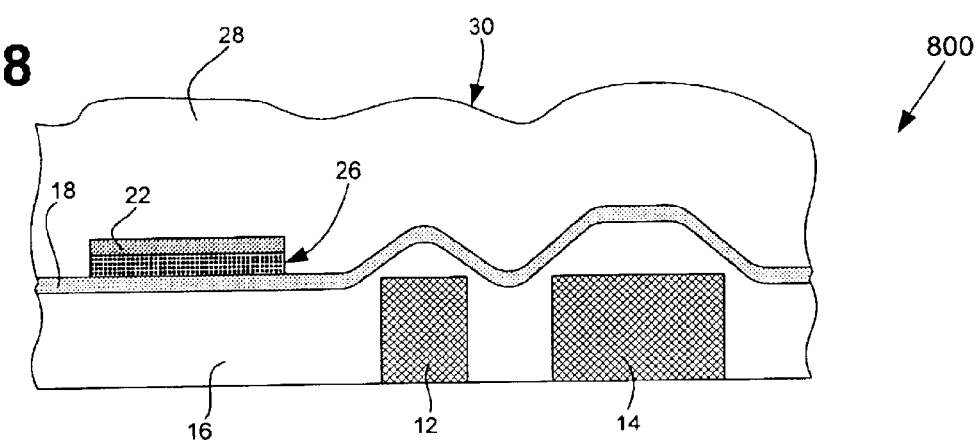
FIG. 8 illustrates a cross sectional view of the exemplary structure of FIG. 7 after the deposition of a IMD layer, in accordance with one embodiment of the present invention.

FIG. 8 shows structure 700 in FIG. 7 after deposition of IMD layer 28. IMD layer 28 can comprise undoped silica glass ("USG"), and may be deposited using a PECVD process. Deposition of IMD layer 28 is part of a standard aluminum backend processing used to complete IMD layer 16. In other words, in a standard aluminum backend process, IMD layer 16 is deposited in the first part of a two-part process and IMD layer 28 is deposited in the second part of the two-part process. In another embodiment, IMD layer 28 may comprise silicon dioxide or other suitable dielectric with a low dielectric constant, i.e. a low k dielectric. Thus, the present invention's novel process steps used to form metal resistor 26 advantageously fit between the steps used in a standard aluminum backend process. As shown in FIG. 8, top surface 30 of IMD layer 28 is typically irregular.

Figure 9:
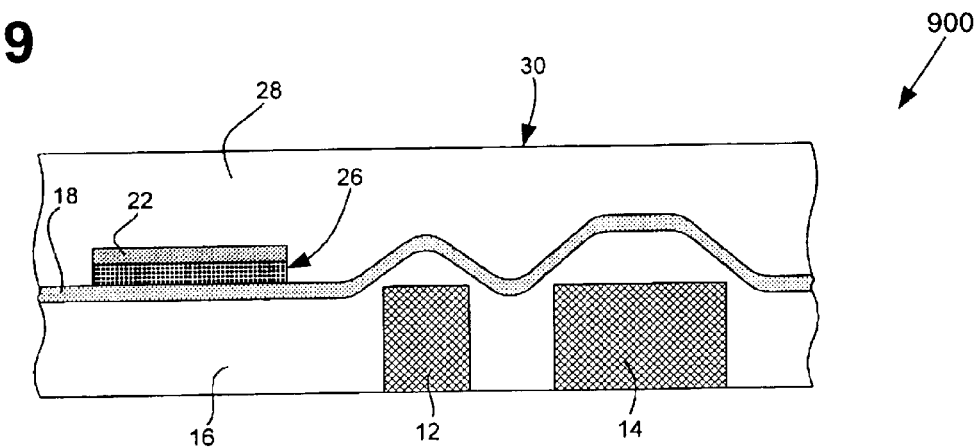
FIG. 9 illustrates a cross sectional view of the exemplary structure of FIG. 8 after chemical mechanical polishing of the top surface of the IMD layer, in accordance with one embodiment of the present invention.

FIG. 9 shows structure 800 in FIG. 8 after chemical mechanical polishing ("CMP"), which is used to planarize top surface 30 of IMD layer 28. By way of background, CMP is a wafer flattening and polishing process that combines chemical removal with mechanical buffing, and is used, among other things, for wafer planarization during the wafer fabrication process.

Figure 10:
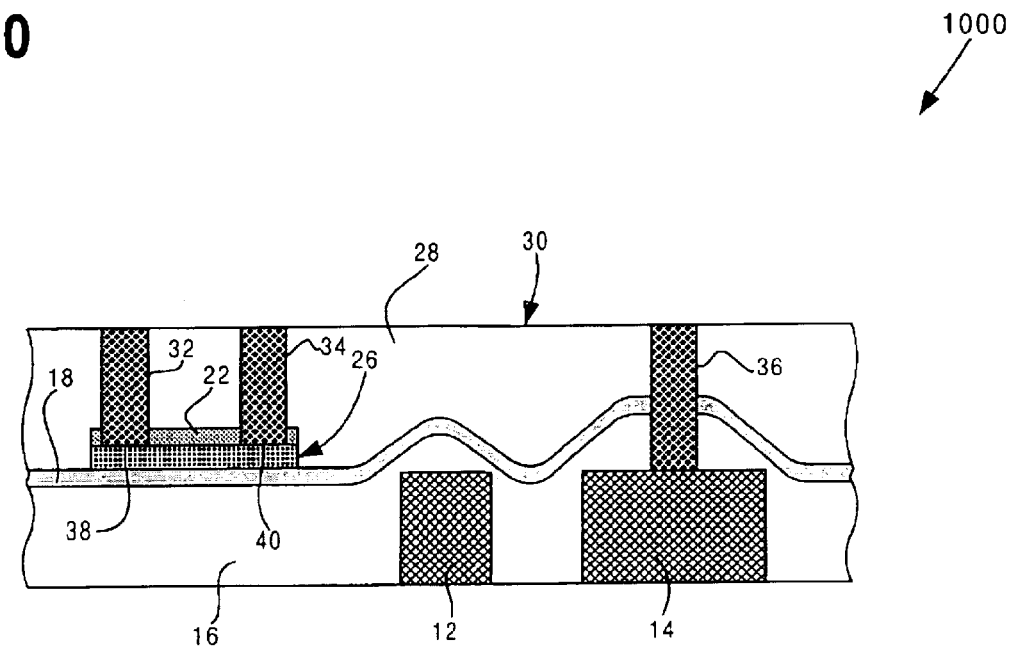
FIG. 10 illustrates a cross sectional view of the exemplary structure of FIG. 9 after formation of via plugs, in accordance with one embodiment of the present invention.

FIG. 10 shows structure 900 in FIG. 9 after formation of intermediate vias 32 and 34 and interlayer via 36. Intermediate vias 32 and 34 can be formed by selectively etching IMD layer 28 using a via etch process known to a person of ordinary skill in the art. However, the via etch process utilized to etch intermediate vias 32 and 34 must have sufficient selectivity to dielectric cap layer 22 and resistor metal layer 20 so as not to etch completely through metal resistor 26.

In one embodiment, intermediate vias may be formed by selectively etching IMD layer 16 and oxide cap layer 18. In that embodiment, the intermediate vias may connect terminals 38 and 40 of metal resistor 26 to metal segments patterned in metal layer 10, such as metal segments 12 and 14. Interlayer via 36 may be formed by etching IMD layer 28, oxide cap layer 18, and IMD layer 16 by a standard via etch process. Intermediate vias 32 and 34 and interlayer via 36 may be filled by using a fill comprised of a suitable electrically conducting metal, such as tungsten.

In FIG. 10, intermediate via 32 is connected to terminal 38 at a first end of metal resistor 26, and intermediate via 34 is connected to terminal 40 at a second end of metal resistor 26. Intermediate vias 32 and 34, respectively, provide electrical connectivity between terminals 38 and 40 of metal resistor 26 and an interconnect metal layer (not shown in FIG. 10) above metal resistor 26. Interlayer via 36 provides a connection between metal segment 14 in interconnect metal layer 10 and other devices on the same IC chip in an interconnect metal layer (not shown in FIG. 10) above IMD layer 28.

Figure 11:
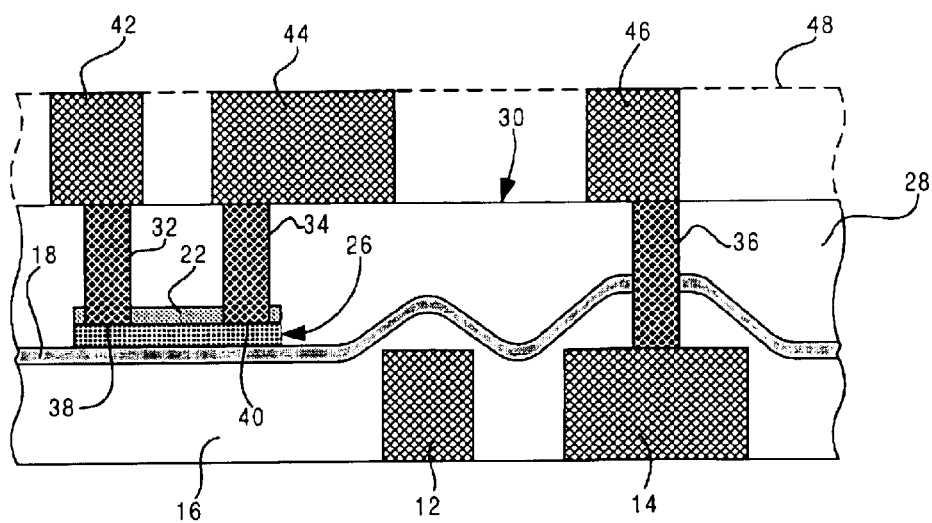
FIG. 11 illustrates a cross sectional view of the exemplary structure of FIG. 10 after subsequent patterning in the interconnect metal layer, in accordance with one embodiment of the present invention.

FIG. 11 shows structure 1000 in FIG. 10 after subsequent patterning in interconnect metal layer 48. The patterning in interconnect metal layer 48 can include, for example, various steps of deposition, masking, etching, and photoresist stripping, as are known in the art, to form metal segments 42, 44, and 46 shown in FIG. 11. Interconnect metal layer 48, for example, may comprise aluminum. As shown in FIG. 11, intermediate vias 32 and 34, respectively, connect terminals 38 and 40 of metal resistor 26 to metal segments 42 and 44 in interconnect metal layer 48. Interlayer via 36 connects metal segment 14 in interconnect metal layer 10 to metal segment 46 in interconnect metal layer 48.

Thus, as described above, the present invention's metal resistor can be advantageously integrated into a standard aluminum backend process used in IC chip fabrication. In other words, the present invention's metal resistor can be advantageously added to the aluminum backend process without impacting or disturbing the aluminum backend process flow.

Also, the invention's novel scheme of interrupting a standard two-step dielectric deposition, i.e. deposition of IMD layer 16 and IMD layer 28, to integrate the invention's metal resistor, i.e. metal resistor 26, between interconnect metal layer 10 and interconnect metal layer 48 does not significantly increase the via etch depth, and thus allows the via etch process to be kept simple.

Additionally, in contrast to conventional polysilicon resistors fabricated close to the silicon substrate, the present invention provides a metal resistor that is fabricated between interconnect metal layers in the IC chip, and thus can be fabricated at a greater distance from the silicon substrate than conventional polysilicon resistors. By way of background, the parasitic capacitance between a resistor, such as the invention's metal resistor, and the silicon substrate is inversely proportional to the distance between the resistor and the silicon substrate. Thus, the present invention advantageously achieves a metal resistor having reduced parasitic capacitance between the silicon substrate compared to a conventional polysilicon resistor.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for fabricating a metal resistor in an IC chip and related structure have been described.

What is claimed is:

1. An integrated circuit chip formed in a semiconductor substrate, comprising:
    a first interconnect metal layer in said semiconductor substrate;
    a first intermetallic dielectric layer in said semiconductor substrate situated over said first interconnect metal layer;
    a metal resistor in said semiconductor substrate situated over said first intermetallic dielectric layer, said metal resistor being only connected to a second interconnect metal layer;
    a dielectric cap layer in said semiconductor substrate patterned on said metal resistor;
    a second intermetallic dielectric layer in said semiconductor substrate formed over said dielectric cap layer and said metal resistor;
    said second interconnect metal layer in said semiconductor substrate being situated over said second interinetallic dielectric layer;
    a first intermediate via in said semiconductor substrate connected to a first terminal of said metal resistor, said first intermediate via being further connected to a first metal segment patterned in said second interconnect metal layer;
    a second intermediate via in said semiconductor substrate connected to a second terminal of said metal resistor, said second intermediate via being further connected to a second metal segment patterned in said second interconnect metal layer.

2. The integrated circuit chip of claim 1 wherein said metal resistor is selected from the group consisting of titanium nitride and tantalum nitride.

3. The integrated circuit chip of claim 1 wherein said first interconnect metal layer comprises aluminum.

4. The integrated circuit chip of claim 1 wherein said first intermetallic dielectric layer comprises HDPCVD silicon dioxide.

5. The integrated circuit chip of claim 1 wherein said second intermetallic dielectric layer comprises undoped silica glass.

6. The integrated circuit chip of claim 1 wherein said dielectric cap layer comprises silicon nitride.

7. The integrated circuit chip of claim 1 further comprising an oxide cap layer situated between said metal resistor and said first intermetallic dielectric layer.

8. The integrated circuit chip of claim 7 wherein said oxide cap layer comprises PECVD silicon dioxide.

9. The integrated circuit chip of claim 1 wherein said metal resistor is not connected from below.

10. The integrated circuit chip of claim 1 wherein the thickness of said metal resistor is approximately 100.0 Angstroms to 1500.0 Angstroms.

11. An integrated circuit chip formed in a semiconductor substrate, comprising:
    a first interconnect metal layer in said semiconductor substrate;
    a first intermetallic dielectric layer in said semiconductor substrate situated over said first interconnect metal layer;
    a metal resistor in said semiconductor substrate situated over said first intermetallic dielectric layer, said metal resistor being only connected to a second interconnect metal layer;
    a dielectric cap layer in said semiconductor substrate patterned on said metal resistor;
    a second intermetallic dielectric layer in said semiconductor substrate formed over said dielectric cap layer and said metal resistor;
    said second interconnect metal layer in said semiconductor substrate being situated over said second intermetallic dielectric layer;
    a first intermediate via in said semiconductor substrate connected to a first terminal of said metal resistor and said second interconnect metal layer;
    a second intermediate via in said semiconductor substrate connected to a second terminal of said metal resistor and said second interconnect metal layer.

12. The integrated circuit chip of claim 11 wherein said metal resistor is selected from the group consisting of titanium nitride and tantalum nitride.

13. The integrated circuit chip of claim 11 wherein said first intermetallic dielectric layer comprises HDPCVD silicon dioxide.

14. The integrated circuit chip of claim 11 wherein said second intermetallic dielectric layer comprises undoped silica glass.

15. The integrated circuit chip of claim 11 wherein said dielectric cap layer comprises silicon nitride.

16. The integrated circuit chip of claim 11 wherein said first interconnect metal layer comprises aluminum.

17. The integrated circuit chip of claim 11 further comprising an oxide cap layer situated between said metal resistor and said first intermetallic dielectric layer.

18. The integrated circuit chip of claim 17 wherein said oxide cap layer comprises PECVD silicon dioxide.

19. The integrated circuit chip of claim 11 wherein said metal resistor is not connected from below.

20. The integrated circuit chip of claim 11 wherein the thickness of said metal resistor is approximately 100.0 Angstroms to 1500.0 Angstroms.

* * * * *